United States Patent
Lin et al.

(10) Patent No.: US 9,548,329 B2
(45) Date of Patent: Jan. 17, 2017

(54) BACKSIDE ILLUMINATED IMAGE SENSOR AND METHOD OF MANUFACTURING THE SAME

(71) Applicant: TAIWAN SEMICONDUCTOR MANUFACTURING COMPANY LTD., Hsinchu (TW)

(72) Inventors: Huan-En Lin, Kaohsiung (TW); Shiu-Ko Jangjian, Tainan (TW); Volume Chien, Tainan (TW); Fu-Tsun Tsai, Tainan (TW); Yung-Lung Hsu, Tainan (TW); Chi-Cherng Jeng, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 100 days.

(21) Appl. No.: 14/322,469

(22) Filed: Jul. 2, 2014

(65) Prior Publication Data

US 2016/0005781 A1 Jan. 7, 2016

(51) Int. Cl.
*H01L 27/146* (2006.01)

(52) U.S. Cl.
CPC ..... *H01L 27/14643* (2013.01); *H01L 27/1464* (2013.01); *H01L 27/14623* (2013.01); *H01L 27/14634* (2013.01); *H01L 27/14636* (2013.01); *H01L 27/14689* (2013.01); *H01L 27/14621* (2013.01); *H01L 27/14627* (2013.01)

(58) Field of Classification Search
CPC ........... H01L 27/1464; H01L 27/14685; H01L 27/14621; H01L 27/1463; H01L 27/14627; H01L 27/14636; H01L 27/14645; H01L 27/14643
USPC .............. 257/432, E21.127, 447; 438/70, 65
See application file for complete search history.

(56) References Cited

U.S. PATENT DOCUMENTS

| | | | |
|---|---|---|---|
| 2013/0056800 A1* | 3/2013 | Lyu | H01L 27/14601 257/225 |
| 2013/0153973 A1* | 6/2013 | Hynecek | H01L 27/1461 257/258 |
| 2013/0249040 A1* | 9/2013 | Liu | H01L 27/14623 257/435 |

* cited by examiner

*Primary Examiner* — David Vu
*Assistant Examiner* — Jonathan Han
(74) *Attorney, Agent, or Firm* — Chun-Ming Shih

(57) ABSTRACT

A backside illuminated (BSI) image sensor device includes: a first substrate including a front side and a back side; a second substrate bonded with the first substrate on the front side; and a blocking layer between the first substrate and the second substrate. The first substrate includes an image sensor, and the image sensor is configured to collect incident light entering from the back side. The second substrate includes a circuit coupled with the image sensor. The blocking layer is configured to block radiation induced by the circuit.

20 Claims, 8 Drawing Sheets

BACKSIDE ILLUMINATED IMAGE SENSOR AND METHOD OF MANUFACTURING THE SAME

FIELD

The present disclosure relates to a semiconductor image sensor.

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications.

A backside illuminated (BSI) image sensor device is one type of image sensor device. Image pixels in the BSI image sensor device generate electrical signals in response to incident light. Magnitudes of the electrical signals depend on the intensity of the incident light received by the respective image pixels. However, as the size of transistor devices shrinks with each technological generation, existing BSI image sensor devices may begin to suffer from issues related to electrical or optical crosstalk. For example, unwanted radiation may be generated in an application specific integrated circuit (ASIC) substrate. This unwanted radiation may transfer to the image pixels and influence the magnitude of image signals, which may cause a hot spot phenomenon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
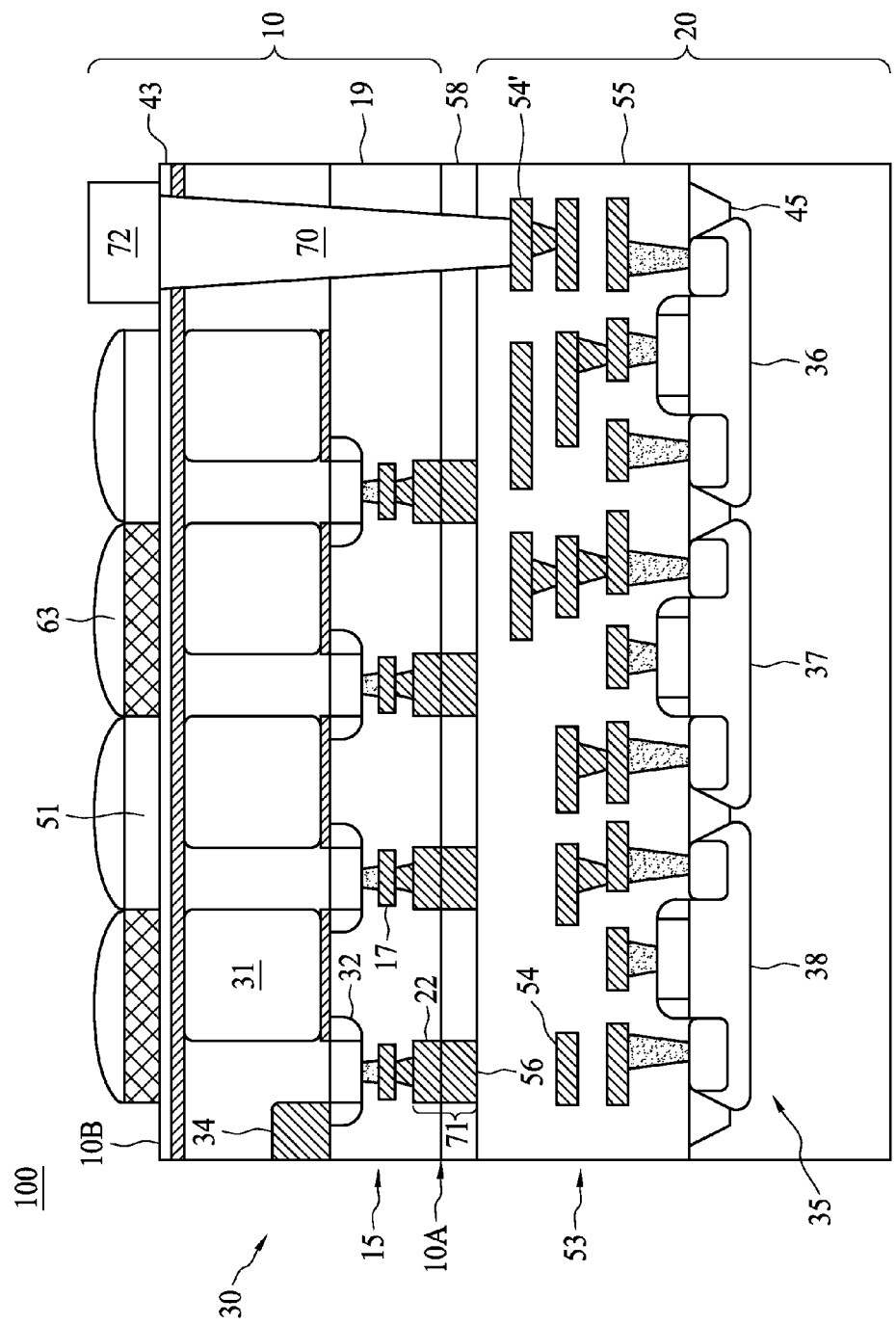
FIG. 1 is a cross-sectional view illustrating a backside illuminated (BSI) image sensor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The term "isolation," as used herein, refers to an oxide structure or a dielectric structure for isolating devices. There are two typical formation processes, one is Local Oxidation of Silicon (LOCOS) and the other is Shallow Trench Isolation (STI). In an image sensor, the isolation is disposed between image pixels and adjacent image pixels so as to isolate the adjacent image pixels. In addition, the isolation is configured to act as a barrier to keep charge carriers (holes or electrons) from penetrating into an adjacent image pixel.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

In a backside illuminated (BSI) device, incident light entering from a back side of a substrate can hit a radiation-sensing region through a direct path without the obstructions of dielectric layers and interconnect layers located at a front side of the substrate. The BSI device helps to increase the number of photons converted into electrons, and makes the CMOS sensor more sensitive to the light source. Further, three-dimensional (3D) integrated circuits (ICs) are used to achieve a high density of pixels for image sensor packaging. When a CMOS sensor is packaged in a 3D IC, a CMOS sensor substrate and its related application specific integrated circuit (ASIC) substrate are bonded together and electrically coupled. Unfortunately, during the operation, a radiation wave is induced by an electron/hole re-combination in the ASIC substrate. For example, a depletion region in a transistor or a P-N junction is subject to generate a re-combination of an electron-hole pair. The radiation wave induced by the ASIC substrate scatters into the CMOS sensor substrate. The radiation-sensing region receives the radiation wave and then converts the radiation wave into additional charges, which strengthen the image signal. Thus, the radiation wave from the ASIC substrate causes a hot spot phenomenon in the pixel array on the ASIC substrate and degrades pixel performance. The hot spot phenomenon is caused by receiving excess radiation. The excess radiation is transformed into additional charges, which enlarge the magnitude of the image signal. As such, the hot spot phenomenon exhibits that one of the image pixels is much brighter than adjacent image pixels.

In order to solve the problem of the hot spot phenomenon, the present disclosure provides an absorption layer between the ASIC substrate and the CMOS sensor substrate. The absorption layer includes a metal-oxide film with a higher absorption coefficient, which utilizes the characteristic of absorption to eliminate radiation waves transferring from the ASIC substrate to the CMOS sensor substrate. This high absorption coefficient film could decay radiation and prevent transportation of radiation waves. Therefore, the absorption layer shields and absorbs radiation waves from the ASIC substrate and mitigates the hot spot phenomenon in the pixel array.

In reference to the drawings, FIG. 1 is a cross-sectional view illustrating a backside illuminated (BSI) image sensor device 100 in accordance with some embodiments of the present disclosure. The BSI image sensor device 100 includes a first substrate 10 and a second substrate 20. The first substrate 10 refers to a complementary metal-oxide-semiconductor (CMOS) sensor substrate or an image sensor chip, and the second substrate 20 refers to an application specific integrated circuit (ASIC) substrate or a device chip. A blocking layer 58 is located between the first substrate 10 and the second substrate 20.

The substrate 10 further includes an image sensor 30, an interconnect region 15, color filters 51 and micro lenses 63. The substrate 10 further includes a front side 10A and a back side 10B. The interconnect region 15 is more proximal to the front side 10A compared to the image sensor 30. The image sensor 30 is located in the substrate 10 and arranged adjacent to other image sensors. The color filters 51 are disposed on the back side 10B, wherein each color filter 51 is aligned with one corresponding image sensor. The micro lenses 63 are disposed on the color filters 51.

The image sensor 30 includes a radiation-sensing region 31, a transfer gate 32 and a charge-to-voltage conversion region 34. The radiation-sensing region 31 is disposed in the substrate 10, which is adjacent to the transfer gate 32. The radiation-sensing region 31 is configured to receive and collect a radiation wave entering from the back side 10B. Specifically, the radiation-sensing region 31 receives photons of the radiation wave and converts the photons into an electrical signal and charges. The radiation-sensing region 31 is implemented as a photodiode, a pinned photodiode, or a p-n junction disposed in the substrate 10, which is able to generate a signal related to the intensity or brightness of light that impinges on the radiation-sensing region 31. The radiation wave induces the radiation-sensing region 31 in order to generate electron-hole pairs in a depletion region of the photodiode. In addition, the radiation-sensing region 31 is able to sense or detect radiation waves at specific wavelengths, which may correspond to lights of different colors.

The transfer gate 32 is disposed laterally adjacent to and coupling with the radiation-sensing region 31. That is, the transfer gate 32 is interposed between the radiation-sensing region 31 and the charge-to-voltage conversion region 34. The transfer gate 32 is implemented as a control gate having a metal gate structure or a polysilicon structure. The electrons or charges in the radiation-sensing region 31 transfer to the charge-to-voltage conversion region 34 under the control of the transfer gate 32. Further, the charge-to-voltage conversion region 34 serves as a region configured for transforming the electrons or charges into a corresponding voltage.

The substrate 10 further includes a buffer layer 43 between the radiation-sensing region 31 and the color filters 51. The buffer layer 43 serves as a planarization for the color filters 51. Material of the buffer layer 43 includes dielectric materials, such as silicon oxide. In some embodiments, a bottom anti-reflective coating (BARC) is also deposited between the radiation-sensing region 31 and the color filters 51. It is appreciated that the buffer layer 43 may have different structures, be formed of different materials, and/or have a different number of layers other than illustrated.

The color filters 51 are disposed on the buffer layer 43 and substantially over the radiation-sensing region 31. Each of the color filters 51 aligns with the corresponding radiation-sensing region 31 respectively. The color filters 51 are configured to filter visible light, such as that of a red, green, or blue wavelength. The color filters 51 include suitable material for optical structures. For example, the color filters 51 include a dye-based (or pigment-based) polymer for filtering out a specific frequency band. Alternatively, the color filters 51 include a resin or other organic-based material having color pigments. The micro lenses 63 are disposed over the color filters 51. The micro lenses 63 focus radiation waves on the radiation-sensing region 31. The micro lenses 63 include a suitable material with a variety of shapes and sizes depending on an index of refraction of the material.

Within the interconnect region 15, it includes a multilayer interconnect (MLI) 17, an interlayer (or inter-level) dielectric (ILD) layer 19 and a bond pad 22. The MLI 17 and the bond pad 22 are surrounded by the ILD layer 19. The ILD layer 19 separates and isolates the MLI 17 from other MLI structures. The ILD layer 19 includes a surface facing toward the second substrate 20, which is coplanar with the bond pad 22 and forms the front side 10A. The MLI 17 and the bond pad 22 are configured to connect the image sensor 30 with other image sensors or transistors for signal transmission. For example, the bond pad 22 provides a connection between the first substrate 10 and the second substrate 20.

The multilayer interconnect (MLI) 17 includes various conductive features, for example, vertical interconnects or horizontal interconnects. Material of the MLI 17 includes conductive materials, such as aluminum, aluminum/silicon/copper alloy, titanium, titanium nitride, tungsten, polysilicon, metal silicide, or combinations thereof.

The interlayer dielectric (ILD) layer 19 has a multilayer structure. Boundaries between different layers resided in ILD 19 are omitted in the drawing. In some embodiments, material of the ILD layer 19 includes silicon dioxide, silicon nitride, silicon oxynitride, TEOS oxide, phosphosilicate glass (PSG), borophosphosilicate glass (BPSG), fluorinated silica glass (FSG), carbon doped silicon oxide, Xerogel, Aerogel, amorphous fluorinated carbon, Parylene, BCB (bisbenzocyclobutenes), SiLK (Dow Chemical, Midland, Mich.), polyimide, other suitable materials, or combinations thereof.

The second substrate 20 includes a read-out circuit 35 coupling with the image sensor 30. Specifically, the read-out circuit 35 connects with the charge-to-voltage conversion region 34. The read-out circuit 35 is integrated by p-channel MOSFETs (metal-oxide-semiconductor field-effect transistors) or n-channel MOSFETs. The read-out circuit 35 includes a reset transistor 36, a source follower transistor 37 and a row selector transistor 38. The reset transistor 36 is configured for discharging the image sensor 30 and resets the image sensor 30 back to an original status. Specifically, the reset transistor 36 is coupled between a power rail VDD and the charge-to-voltage conversion region 34 so as to reset (e.g., discharge or charge to a preset voltage) under the control of a reset signal. The source follower transistor 37 is coupled with the reset transistor 36, wherein the source follower transistor 37 is configured to amplify signals in the read-out circuit 35. The row selector transistor 38 is coupled with the source follower transistor 37. The second substrate 20 further includes one or more Image Signal Processing (ISP) circuits, such as Analog-to-Digital Converters (ADCs), Correlated Double Sampling (CDS) circuits, row decoders, and the like.

Shallow trench isolations 45 separate the reset transistor 36, the source follower transistor 37 and the row selector transistor 38. The shallow trench isolations 45 define active regions of the read-out circuit 35. Material of the shallow trench isolations 45 includes dielectric materials, such as silicon oxide or silicon nitride.

The second substrate 20 further includes an interconnect region 53, which is similar to the composition of the interconnect region 15. The interconnect region 53 is located over the read-out circuit 35. The interconnect region 53 further includes a multilayer interconnect (MLI) 54 and an interlayer (or inter-level) dielectric (ILD) layer 55. Boundaries between different layers resided in ILD layer 55 are omitted in the drawing. Further, the MLI 54 is surrounded by the ILD layer 55. The ILD layer 55 separates and isolates the MLI 54 from other MLI structures. The MLI 54 is configured to connect the read-out circuit 35 with other circuits for signal transmission.

The first substrate 10 and the second substrate 20 are bonded together face-to-face without using a carrier wafer, wherein corresponding bond pads of the first substrate 10 are aligned with bond pads of the second substrate 20 and bonded together in a one-to-one fashion. For example, the first substrate 10 includes a bond pad 22 at the front side 10A. The bond pad 22 is bonded to a bond pad 56 of the second substrate 20 in a one-to-one aligned fashion so as to form a pad connection 71. The pad connection 71 penetrates through the blocking layer 58, wherein the blocking layer 58 covers comprehensively over the second substrate 20 but does not cover the pad connection 71 and other pad connections. In an embodiment, the pad connection 71 includes conductive material and the blocking layer 58 includes insulative material. Due to the insulative material of the blocking layer 58, signals in the pad connection 71 are not able to leak through the blocking layer 58. Further, the first substrate 10 and the second substrate 20 are bonded together by using adhesive bonding, direct copper bonding and direct oxide bonding, or any other method. For example, the first substrate 10 has the bond pad 22 at the front side 10A facing toward the second substrate 20, and the second substrate 20 has the bond pad 56 exposed on a surface facing toward the first substrate 10. The first substrate 10 and the second substrate 20 are bonded by applying a high pressure so that the bond pads 22 and 56, which are copper pads, are bonded together. In an embodiment, bond pads are of different sizes and configured in different rows so as to be disjointed from each other. Additional dummy pads may be added to increase the bonding strength between the first substrate 10 and the second substrate 20.

A through via 70 is spaced apart from the image sensor 30 and extending from the back side 10B of the first substrate 10 to the second substrate 20, wherein the through via 70 penetrates through the blocking layer 58. In an embodiment, the through via 70 includes conductive material that is different from the insulative material of the blocking layer 58. As such, the blocking layer 58 will not become a leakage path as signals transmit by the through via 70. Further, the through via 70 connects a contact 72 with a conductive trace 54' of the multilayer interconnect (MLI) 54. As such, the through via 70 functions as an electrical or physical interconnection between the first substrate 10 and the second substrate 20. The through via 70 is made of a conductive material including, for example, one material selected from the group consisting of copper (Cu), platinum (Pt), tungsten (W), aluminum (Al), and an alloy thereof. In addition, the through via 70 is formed in a circular, oval, or polygonal (such as triangular, rectangular, pentagonal, etc.) shape. There is no limitation in the number and size (i.e. width) of the through via 70.

The blocking layer 58 is sandwiched between the first substrate 10 and the second substrate 20. Further, the blocking layer 58 is interposed between the radiation-sensing region 31 and the read-out circuit 35. The blocking layer 58 is made of a high absorption coefficient material. For example, the blocking layer 58 is made of non-transparent metal silicide which can absorb a radiation wave. In an embodiment, the blocking layer 58 includes a heterogeneous stack of layers. For example, the blocking layer 58 further includes a photon shielding surface facing toward the second substrate 20, wherein the photon shielding surface is made of reflective or refractive material so as to shield against any radiation waves. In an embodiment, the blocking layer 58 includes a reflective layer and an absorption layer, wherein the absorption layer is able to decay and reflect the radiation waves. In an embodiment, the blocking layer 58 includes at least two metal silicide layers, wherein each of the metal silicide layers has different material and features.

The blocking layer 58 is also regarded as an absorption layer, wherein the blocking layer 58 is configured to absorb a radiation wave induced by the read-out circuit 35 and prevent the radiation wave from penetrating into the radiation-sensing region 31. Specifically, the reset transistor 36, the source follower transistor 37 and the row selector transistor 38 include depletion regions where an electron-hole pair is combined and transformed into a radiation wave. The depletion region is located adjacent to an interface between a p-type doped region and an n-type doped region where the interface refers to a P-N junction. Otherwise, the depletion region is formed in a channel region when a voltage is applied on a gate structure. The radiation wave generated by the read-out circuit 35 is blocked or absorbed by the blocking layer 58 so as not to influence the image sensor 30 or the radiation-sensing region 31. In an embodiment, the second substrate 20 further includes a support circuit, such as Image Signal Processing (ISP) circuits, connected to the read-out circuit 35. The support circuit is configured for processing signals from the read-out circuit 35. The support circuit includes P-N junctions where an electron-hole pair is combined and transformed into a radiation wave; however, the radiation wave is blocked or absorbed by the blocking layer 58 so as not to influence the image sensor 30.

The blocking layer 58 not only blocks the radiation wave incident from the second substrate 20, but also blocks radiation waves entering from the back side 10B. The radiation waves coming from the back side 10B further penetrating through the first substrate 10 is blocked or absorbed by the blocking layer 58 so as not to influence the read-out circuit 35.

In an embodiment, the blocking layer 58 is able to block photonic noises generated from areas such as interconnect region 53 or the through via 70. The interconnect region 53 connects the read-out circuit 35 with the support circuit, and also connects with the interconnect region 15 by the pad connection 71. In operation, the interconnect region 53 induces photonic noise while conducting electrical current, wherein the induced photonic noise is generated from crosstalk, leakage or frequency coupling. The photonic noise generated by the interconnect region 53 is blocked or absorbed by the blocking layer 58 so as not to penetrate into the image sensor 30. Another photonic noise source is the through via 70. Similarly, photonic noise generated by the through via 70 is absorbed by the blocking layer 58.

Since the blocking layer 58 with a higher absorption coefficient absorbs radiation waves induced by the read-out circuit 35 or other interconnection features such as interconnect region 53 and through via 70, the radiation-sensing region 31 will not collect radiation waves generating from the second substrate 20. The absorption characteristic of the blocking layer 58 eliminates additional radiation waves transferring from the second substrate 20 to the first substrate 10. The radiation-sensing region 31 in the first substrate 10 thus cannot transform such additional radiation waves into charges; whereby, image signals are not influenced and the hot spot phenomenon will not occur. Therefore, the blocking layer 58 absorbs radiation waves or noise from the second substrate 20 and mitigates the hot spot phenomenon in the pixel array.

Figure 2:
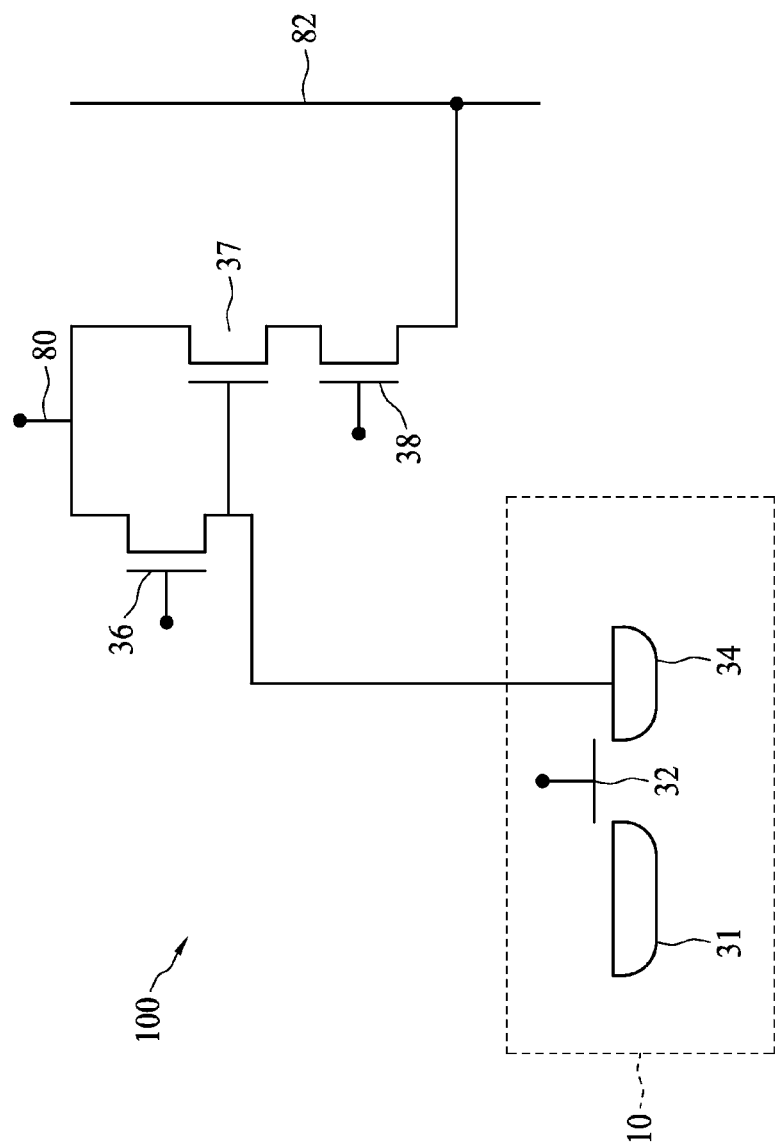
FIG. 2 represents a circuit topology of the BSI image sensor device of FIG. 1 in accordance with some embodiments of the present disclosure.

FIG. 2 represents a circuit topology of the backside illuminated (BSI) image sensor device 100 of FIG. 1 in accordance with some embodiments of the present disclosure. Referring to FIG. 2, the BSI image sensor device 100 includes a radiation-sensing region 31, a transfer gate 32, a charge-to-voltage conversion region 34, a reset transistor 36, a source follower transistor 37 and a row selector transistor 38. The radiation-sensing region 31, the transfer gate 32, and the charge-to-voltage conversion region 34 are located within a first substrate 10. A drain terminal of the row selector transistor 38 is connected to a source terminal of the source follower transistor 37. A source terminal of the row selector transistor 38 is connected to an output Vout 82. Drain terminals of the reset transistor 36 and the source follower transistor 37 are maintained at a potential $V_{DD}$ 80. A source terminal of the reset transistor 36 and a gate terminal of the source follower transistor 37 are connected to the charge-to-voltage conversion region 34. The BSI image sensor device 100 is called a 4-T image sensor. It should be appreciated that embodiments of the present disclosure are not limited to 4-T image pixel architectures; rather, one of ordinary skill in the art having the benefit of the instant disclosure will understand that the present disclosure is also applicable to 3-T designs, 5-T designs, and various other image pixel architectures. During operation, incident light is received by the radiation-sensing region 31. Electron-hole pairs are generated in response to the received light. The electrons are then collected in the radiation-sensing region 31 and transferred to the charge-to-voltage conversion region 34 via the transfer gate 32. Later, the electrons are converted into electrical signals to be received in the charge-to-voltage conversion region 34. The reset transistor 36 is coupled between the potential $V_{DD}$ 80 and the charge-to-voltage conversion region 34 so as to reset the charge-to-voltage conversion region 34 to a preset voltage. The source follower transistor 37 is coupled between the potential $V_{DD}$ 80 and the row selector transistor 38. The source follower transistor 37 is configured to amplify the electrical signals received from the charge-to-voltage conversion region 34. Finally, the row selector transistor 38 selectively couples to the output Vout 82 where the output Vout 82 is connected with a next stage circuit.

Figure 3:
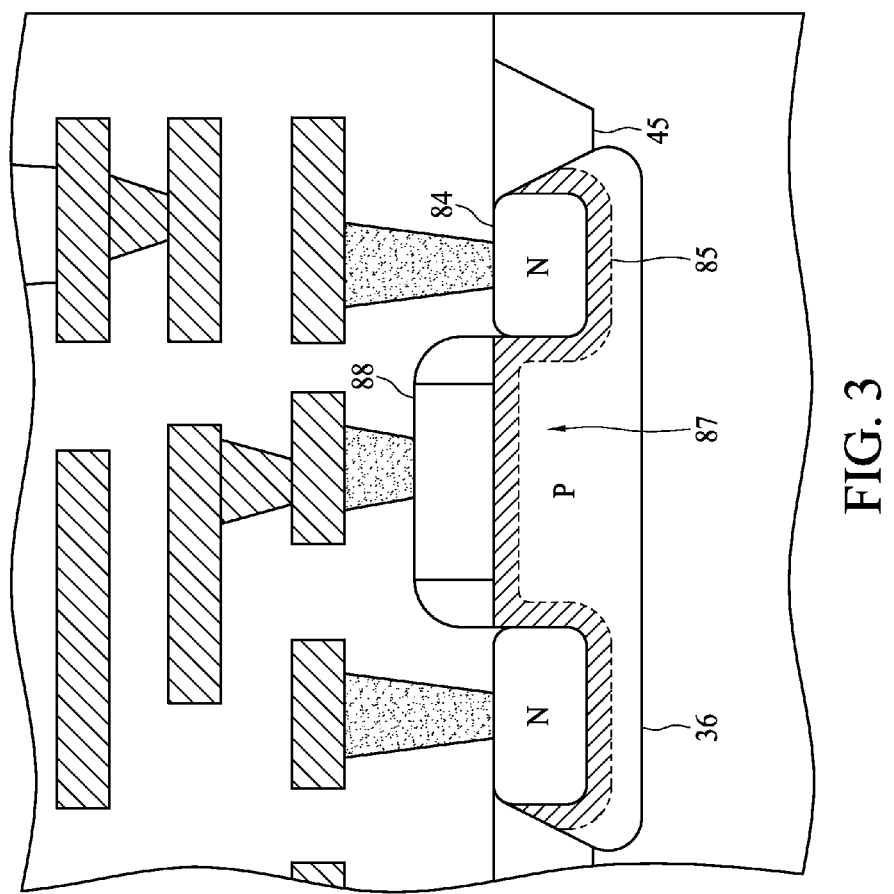
FIG. 3 is a zoom-in diagram illustrating the BSI image sensor device of FIG. 1 in accordance with some embodiments of the present disclosure.

FIG. 3 is a zoom-in diagram illustrating the BSI image sensor device 100 in accordance with some embodiments of the present disclosure. FIG. 3 also illustrates a reset transistor 36, which is a p-channel MOSFET. The reset transistor 36 includes a depletion region 85, which is located adjacent to an interface between a source/drain region 84 and a channel region 87. The interface is a junction between a p-type region and an n-type region. The depletion region 85 is a semiconductor region without carriers where an electron-hole pair is easily combined and transformed into a radiation wave. In addition, the depletion region 85 is formed in the channel region 87 when a voltage is applied on the gate structure 88. Near the blocking layer 58, the radiation waves generated by the depletion region 85 are blocked or absorbed so as not to influence the image sensor 30 or the radiation-sensing region 31.

FIGS. 4A-4E represent a method of manufacturing the BSI image sensor device 100 of FIG. 1 in accordance with some embodiments of the present disclosure. Each figure represents a stage of the method in a cross-sectional perspective view.

Figure 4A:
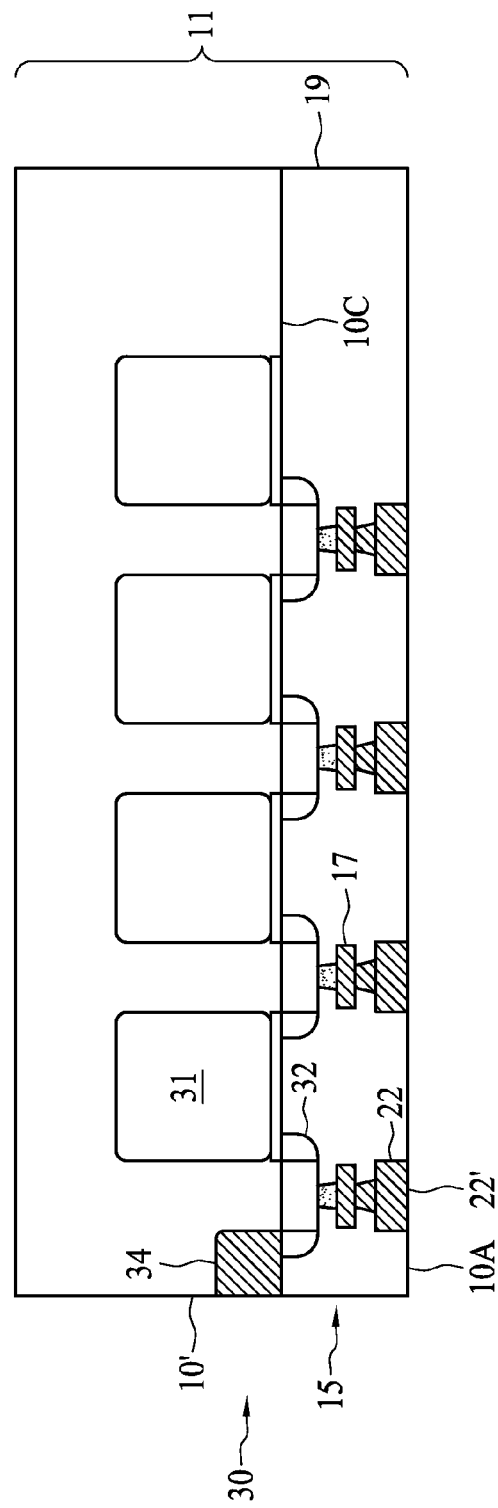
FIGS. 4A-4E represent a method of manufacturing the BSI image sensor device of FIG. 1 in accordance with some embodiments of the present disclosure.

Referring to FIG. 4A, a semiconductor substrate 10' having a surface 10C is provided. The semiconductor substrate 10' includes p-type doping or n-type doping. At least one image pixel is formed in or on the semiconductor substrate 10'. First, a local oxidation of silicon (LOCOS) or a Shallow Trench Isolation (STI) process is performed to define active regions of image pixels on the surface 10C. Thus, the semiconductor substrate 10' includes shallow trench isolations (not shown) in the semiconductor substrate 10' configured to isolate image pixels. Later, at least one gate structure is formed on the surface 10C, for example, a transfer gate 32 is formed on the surface 10C. During formation of the transfer gate 32, a stack of a gate dielectric layer and a gate electrode layer is deposited on the surface 10C. Lithography and an etching process are performed to pattern the stack so as to form a gate stack. A conformal layer of gate sidewall material is deposited on the gate stack and the substrate 10' using a CVD process with an appropriate thickness. Thereafter, the conformal layer of gate sidewall material is subjected to an anisotropic etch so as to form the transfer gate 32.

At least one ion implantation is employed to form radiation-sensing regions and charge-to-voltage conversion regions with different levels of depth and energy. For example, at least one ion implantation is used to form a radiation-sensing region 31 and a charge-to-voltage conversion region 34. When manufacturing the charge-to-voltage conversion region 34, the ion implantation process implants the semiconductor substrate 10' with n-type or p-type dopant so as to form a doped region. When manufacturing the radiation-sensing region 31, the ion implantation process implants the semiconductor substrate 10' separately with n-type and p-type dopants so as to form a photodiode or a pinned diode. The position or configuration of the radiation-sensing region 31 and the charge-to-voltage conversion region 34 is adjusted by tuning an implantation energy level of the implantation process.

Next, an interconnection region 15 is formed over the surface 10C. The interconnection region 15 electrically couples with the image pixels. The interconnection region 15 includes a multilayer interconnect (MLI) 17, an interlayer (or inter-level) dielectric (ILD) layer 19 and a bond pad 22, which are formed by a damascene process such as a dual damascene process or single damascene process. The ILD layer 19 is formed by depositing layers of dielectric material such as silicon oxide or silicon nitride. Lithography and etching processes are performed to pattern the dielectric layers. The dielectric layers are etched to form different sizes of trenches, which refer to dual damascene openings composed of trenches and via holes. Conductive materials, such as aluminum, copper, or the like, are deposited into the dual damascene openings by, for example, CVD, atomic layer deposition (ALD), physical vapor deposition (PVD), electroplating, or a combination thereof. A polishing and/or grinding process, such as a CMP, can remove excess conductive materials. A surface 22' of the bond pad 22 is coplanar with the front side 10A. As such, a first substrate 11 including image sensor 30 is then ready for bonding.

Figure 4B:
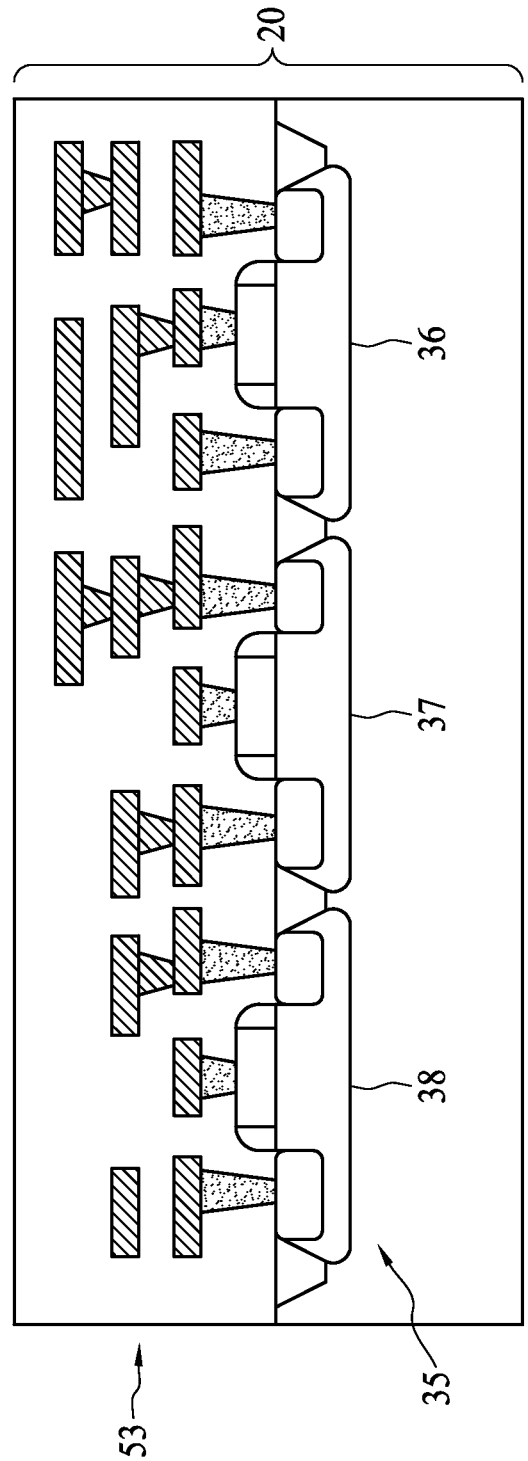

Referring to FIG. 4B, a second substrate 20 including a read-out circuit 35 and a support circuit (not shown) is provided. The read-out circuit 35 and the support circuit are made of p-channel MOSFETs (metal-oxide-semiconductor field-effect transistors) or n-channel MOSFETs. Thus, there are several transistors formed in the second substrate 20. The number of transistors shown is only for illustration purposes and are not limiting. The transistors are formed by IC formation processes. An interconnection region 53 is formed on the read-out circuit 35. The formation method of the interconnection region 53 is similar to that of the interconnection region 15.

Figure 4C:
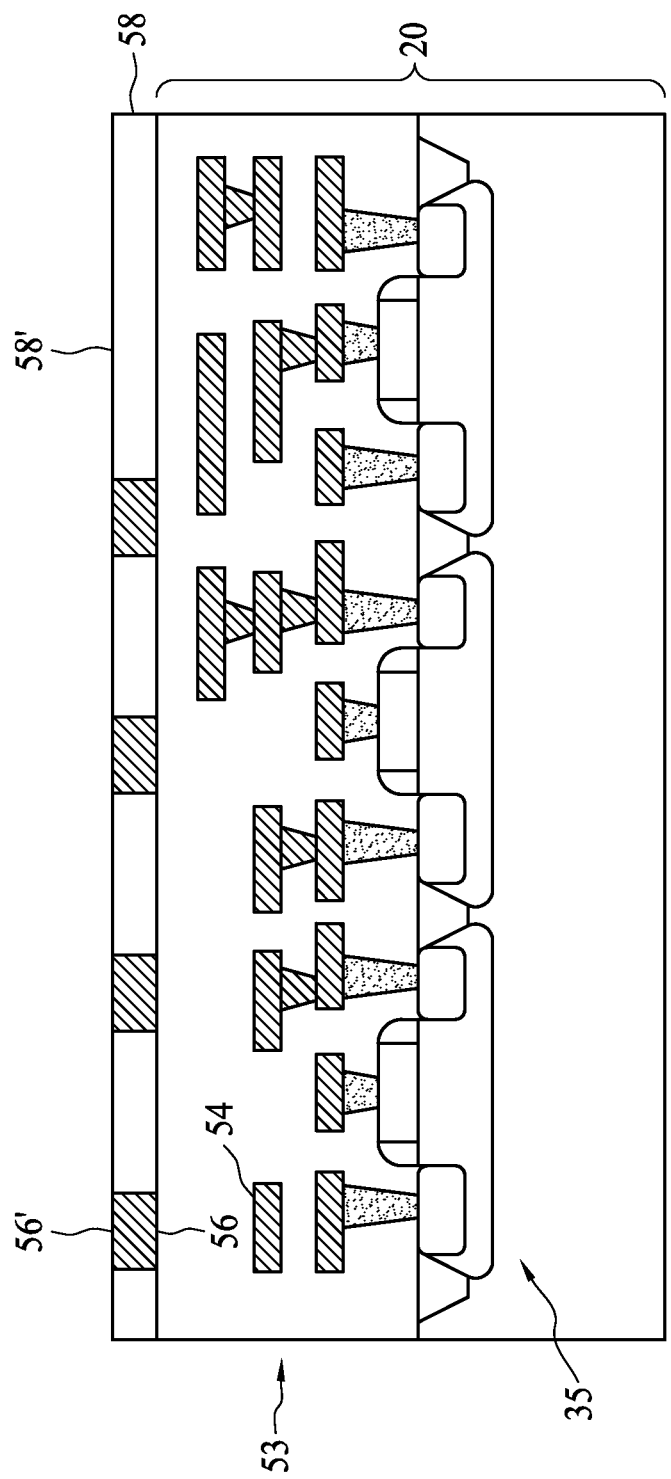

Referring to FIG. 4C, a blocking layer 58 surrounding a bond pad 56 is deposited over the interconnection region 53. The blocking layer 58 inserted with the bond pad 56 is formed by, for example, a damascene process. The blocking layer 58 is deposited over the second substrate 20, wherein the blocking layer 58 includes material such as metal silicide or non-transparent metal silicide. Photoresist lithography and etching processes are performed to pattern the blocking layer 58 in order to form a trench. The trench exposes some conductive traces of the multilayer interconnect (MLI) 54. Later, conductive material is deposited into the trench and over the blocking layer 58. A polishing and/or grinding process is performed on the blocking layer 58 so that excess conductive material can be removed. As such, the bond pad 56 is formed on the second substrate 20, wherein the bond pad 56 has a surface 56' coplanar with a surface 58' of the blocking layer 58. In addition, the bond pad 56 couples with the read-out circuit 35.

Figure 4D:
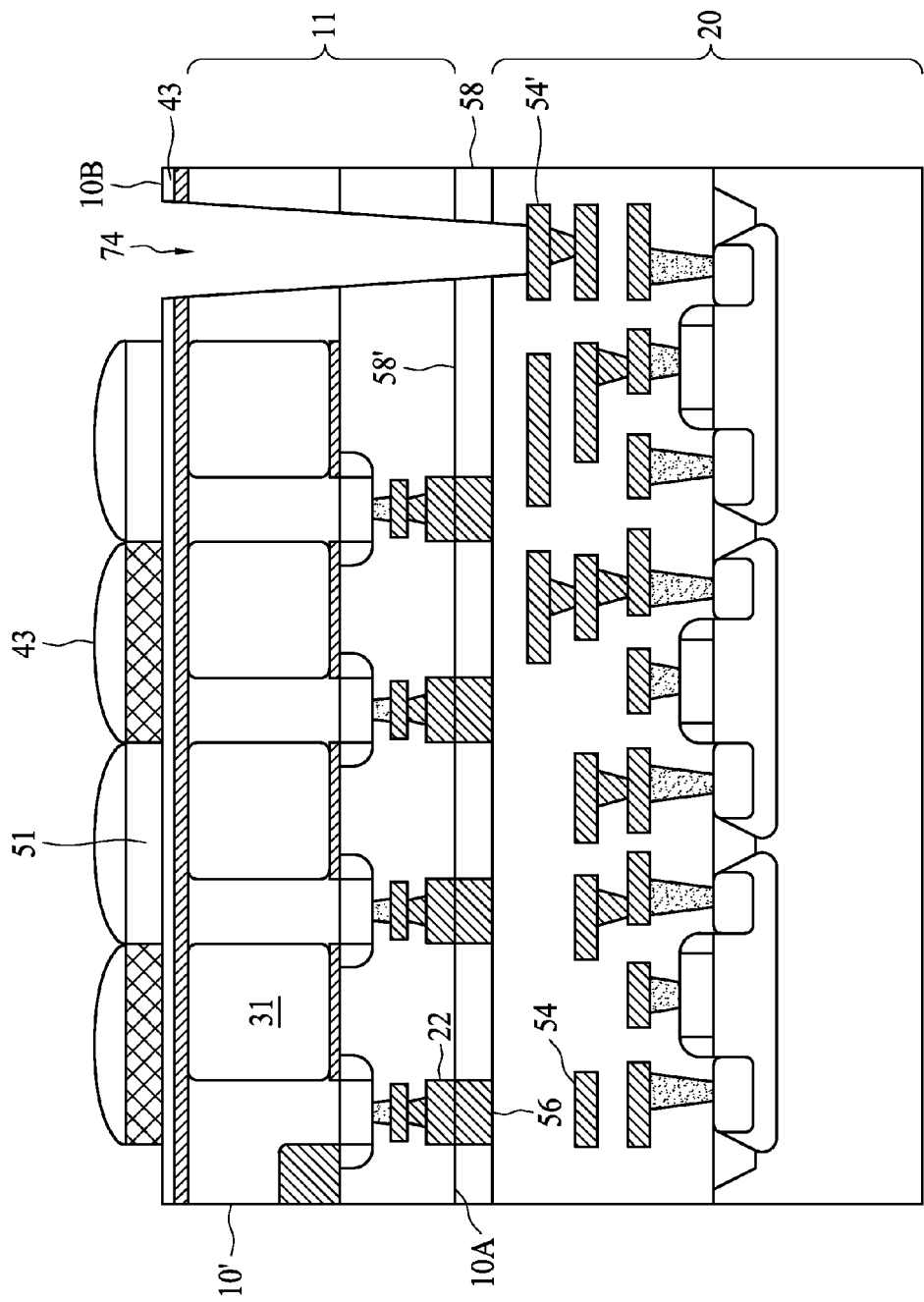

Referring to FIG. 4D, bond pads of the first substrate 11 are bonded to bond pads of the second substrate 20 in a one-to-one fashion. For example, the bond pad 56 is aligned with the bond pad 22 and then bonded by a thermal process or pressure. The front side 10A of the first substrate 11 faces to and bonds with the surface 58' of the blocking layer 58. Accordingly, the blocking layer 58 is located between the first substrate 11 and the second substrate 20.

After bonding the first substrate 11 and the second substrate 20, a thinning process (not shown) is performed on a back side of the first substrate 11 in order to thin down the semiconductor substrate 10'. For example, the thinning process includes a Chemical Mechanical Polishing (CMP)/Planarization process. Alternatively, the thinning process includes a diamond scrubbing process, a grinding process, or other suitable techniques. A substantial amount of material may be removed from the back side by using the thinning process. In an embodiment, the thinning process is performed until portions of the radiation-sensing region 31 are exposed. After the thinning process, the semiconductor substrate 10' is thin enough so that the radiation-sensing region 31 can efficiently receive radiation waves that enter from the back side.

After the step of thinning, deposition processes are performed to form a buffer layer 43. For the buffer layer 43, a deposition process is employed to form a dielectric layer over the radiation-sensing region 31 and then form a back side 10B. The deposition process includes dielectric materials, such silicon oxide, silicon nitride or SiON. In some embodiments, a bottom anti-reflective coating (BARC) is also deposited over the buffer layer 43. Later, color filters 51 are deposited over the back side 10B, wherein each of the color filters 51 includes one of a variety of different colors; for example, red, green, blue, and white. Each color filter 51 aligns with a corresponding one of the radiation-sensing regions. Next, micro lenses 63 are formed over the color filters 51. The micro lenses 63 are formed by, for example, applying and patterning a positive-type photoresist (not shown) over the color filters 51. Once formed, the patterned photoresist may then be baked to round the photoresist into a curved micro lens.

After the thinning and bonding process, an etching process is performed to etch a through via hole 74 extending from the back side 10B. The through via hole 74 extends through the first substrate 11 and the blocking layer 58 and then exposes a conductive trace 54' or an interconnect of the multilayer interconnect (MLI) 54 in the second substrate 20.

Figure 4E:
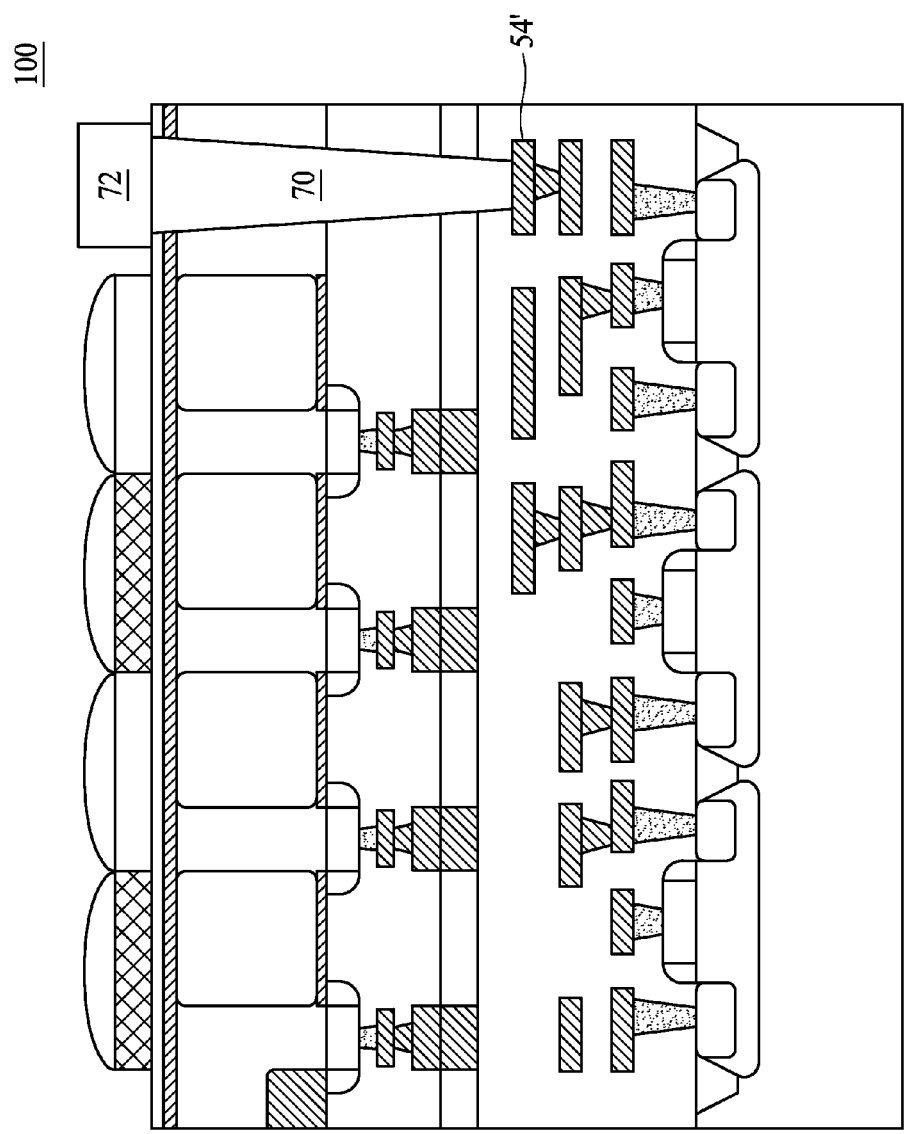

Referring to FIG. 4E, a conductive material is deposited into the through via hole 74 so as to form a through via 70. A contact 72 is formed on the through via 70 and connected with each other. The through via 70 connects the contact 72 with the conductive trace 54' so that signals in the BSI image sensor device 100 can be transferred to external devices.

In brief, in the present disclosure, a blocking layer is introduced to be located between a first substrate and a second substrate of a composite image sensing device. The blocking layer is made of a high absorption coefficient material, wherein the blocking layer is configured to absorb a radiation wave induced by the read-out circuit in the second substrate and prevent the radiation wave from penetrating into a radiation-sensing region in the first substrate. Since the radiation wave is absorbed by the blocking layer, the radiation-sensing region will not receive interference radiation waves from the second substrate. The hot spot phenomenon can be mitigated or eliminated.

A backside illuminated (BSI) image sensor device includes: a first substrate including a front side and a back side; a second substrate bonded with the first substrate on the front side; and a blocking layer between the first substrate and the second substrate. The first substrate includes an image sensor, and the image sensor is configured to collect incident light entering from the back side. The second substrate includes a circuit coupled with the image sensor. The blocking layer is configured to block radiation induced by the circuit.

In some embodiments, the blocking layer includes metal silicide.

In some embodiments, the blocking layer includes a photon shielding surface facing the second substrate.

In some embodiments, the blocking layer includes a heterogeneous stack of layers.

In some embodiments, the circuit further includes: a reset transistor configured for discharging the image sensor; a source follower transistor coupled with the reset transistor; and a row selector transistor coupled with the source follower transistor. The source follower transistor is configured to amplify signals in the circuit. The reset transistor, the source follower transistor and the row selector transistor include depletion regions where an electron-hole pair is combined and transformed into a radiation wave. The radiation wave is blocked by the blocking layer so as not to influence the image sensor.

In some embodiments, the image sensor includes: a radiation-sensing region; a charge-to-voltage conversion region coupled to the radiation-sensing region; and a transfer gate interposed between the radiation-sensing region and the charge-to-voltage conversion region. The radiation-sensing region is configured to convert a radiation wave into charges. A portion of the radiation wave penetrating through the image sensor is blocked by the blocking layer so as not to influence the circuit. The transfer gate is configured for transferring the charges from the radiation-sensing region to the charge-to-voltage conversion region.

In some embodiments, the second substrate further includes a support circuit connected to the circuit. The support circuit is configured for processing signals from the circuit. The support circuit includes a P-N junction where an electron-hole pair is combined and transformed into a radiation wave. The radiation wave is blocked by the blocking layer so as not to influence the image sensor.

In some embodiments, the second substrate further includes an interconnect structure connecting the circuit with other transistors. The interconnect structure is configured to transmit signals and induce noise, which is blocked by the blocking layer so as not to influence the image sensor.

In some embodiments, the first substrate includes a first bond pad at the front side. The first bond pad is bonded to a second bond pad of the second substrate in a one-to-one aligned fashion so as to form a pad connection. The pad connection penetrates through the blocking layer.

In some embodiments, the pad connection includes conductive material and the blocking layer includes insulative material so that signals in the pad connection are not able to leak through the blocking layer.

A backside illuminated (BSI) image sensor device includes: an image sensor chip including a radiation-sensing region and a charge-to-voltage conversion region coupled with the radiation-sensing region; a device chip bonded to the image sensor chip; and an absorption layer sandwiched between the image sensor chip and the device chip. The radiation-sensing region is configured to detect a radiation wave entering from a back side of the image sensor chip. The device chip includes a read-out circuit coupled to the charge-to-voltage conversion region. The absorption layer is configured to absorb a radiation wave induced by the read-out circuit and prevent from penetrating the radiation wave from penetrating into the radiation-sensing region.

In some embodiments, the absorption layer includes non-transparent metal silicide which can absorb a radiation wave.

In some embodiments, the absorption layer is interposed between the radiation-sensing region and the read-out circuit.

In some embodiments, the read-out circuit includes a P-N junction where an electron-hole pair is combined and transformed into a radiation wave. The radiation wave is absorbed by the absorption layer so as not to influence the radiation-sensing region.

In some embodiments, the BSI image sensor device further includes an interconnect structure extending from the back side of the image sensor chip to the device chip, wherein the interconnect structure penetrates through the absorption layer.

In some embodiments, the interconnect structure includes conductive material that is different from the insulative material of the absorption layer.

In some embodiments, the interconnect structure is configured to transmit signals and induce noise, which is absorbed by the absorption layer.

A method for forming a backside illuminated (BSI) image sensor device includes: forming an image sensor in a first substrate including a front side and a back side; forming a circuit in a second substrate; forming a blocking layer over the second substrate; and bonding the front side of the first substrate to the second substrate. The image sensor is responsive to light incident from the back side. The blocking layer is located between the first and second substrate.

The method further includes: patterning the blocking layer to form a trench; depositing conductive material to the trench; and performing a polishing process on the second substrate so as to form a bond pad on the second substrate coupling to the circuit.

The method further includes: etching a through via hole extending from the back side of the first substrate through the blocking layer so as to expose an interconnect of the second substrate; and depositing conductive material into the through via hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A backside illuminated (BSI) image sensor device, comprising:
   a first substrate including a front side and a back side, wherein the first substrate comprises an image sensor, and the image sensor is configured to collect incident light entering from the back side;
   a second substrate bonded with the first substrate on the front side, wherein the second substrate comprises a circuit coupled with the image sensor; and
   a blocking layer interfacing the first substrate and the second substrate, wherein the blocking layer is configured to block radiation induced by the circuit.

2. The BSI image sensor device of claim 1, wherein the blocking layer comprises metal silicide.

3. The BSI image sensor device of claim 1, wherein the blocking layer comprises a photon shielding surface facing the second substrate.

4. The BSI image sensor device of claim 1, wherein the blocking layer comprises a heterogeneous stack of layers.

5. The BSI image sensor device of claim 1, wherein the circuit further comprises:

a reset transistor configured for discharging the image sensor;

a source follower transistor coupled with the reset transistor, wherein the source follower transistor is configured to amplify signals in the circuit; and a row selector transistor coupled with the source follower transistor, wherein the reset transistor, the source follower transistor and the row selector transistor comprise depletion regions where an electron-hole pair is combined and transformed into a radiation wave, and the radiation wave is blocked by the blocking layer so as not to influence the image sensor.

6. The BSI image sensor device of claim 1, wherein the image sensor comprises:

a radiation-sensing region, wherein the radiation-sensing region is configured to convert a radiation wave into charges;

a charge-to-voltage conversion region coupled to the radiation-sensing region; and a transfer gate interposed between the radiation-sensing region and the charge-to-voltage conversion region, wherein the transfer gate is configured for transferring the charges from the radiation-sensing region to the charge-to-voltage conversion region, wherein a portion of the radiation wave penetrating through the image sensor is blocked by the blocking layer so as not to influence the circuit.

7. The BSI image sensor device of claim 1, wherein the second substrate further comprises a support circuit connected to the circuit, and the support circuit is configured for processing signals from the circuit, the support circuit comprises a P-N junction where an electron-hole pair is combined and transformed into a radiation wave, and the radiation wave is blocked by the blocking layer so as not to influence the image sensor.

8. The BSI image sensor device of claim 1, wherein the second substrate further comprises an interconnect structure connecting the circuit with other transistors, and the interconnect structure is configured to transmit signals and induce optical noise, which is blocked by the blocking layer so as not to influence the image sensor.

9. The BSI image sensor device of claim 1, wherein the first substrate comprises a first bond pad at the front side, the first bond pad is bonded to a second bond pad of the second substrate in a one-to-one aligned fashion so as to form a pad connection, and the pad connection penetrates through the blocking layer.

10. The BSI image sensor device of claim 9, wherein the pad connection comprises conductive material and the blocking layer comprises insulative material so that signals in the pad connection are not able to leak through the blocking layer.

11. A backside illuminated (BSI) image sensor device, comprising:

an image sensor chip comprising:

a radiation-sensing region, and the radiation-sensing region is configured to detect a radiation wave entering from a back side of the image sensor chip; and a charge-to-voltage conversion region coupled with the radiation-sensing region;

a device chip bonded to the image sensor chip, wherein the device chip comprises a read-out circuit coupled to the charge-to-voltage conversion region; and an absorption layer in contact with the image sensor chip and the device chip, wherein the absorption layer is configured to absorb a radiation wave induced by the read-out circuit and prevent the radiation wave from penetrating into the radiation-sensing region.

12. The BSI image sensor device of claim 11, wherein the absorption layer comprises non-transparent metal silicide which can absorb a radiation wave.

13. The BSI image sensor device of claim 11, wherein the absorption layer is interposed between the radiation-sensing region and the read-out circuit.

14. The BSI image sensor device of claim 11, wherein the read-out circuit comprises a P-N junction where an electron-hole pair is combined and transformed into a radiation wave, and the radiation wave is absorbed by the absorption layer so as not to influence the radiation-sensing region.

15. The BSI image sensor device of claim 11, further comprising an interconnect structure extending from the back side of the image sensor chip to the device chip, wherein the interconnect structure penetrates through the absorption layer.

16. The BSI image sensor device of claim 15, wherein the interconnect structure comprises conductive material that is different from the insulative material of the absorption layer.

17. The BSI image sensor device of claim 15, wherein the interconnect structure is configured to transmit signals and induce optical noise, which is absorbed by the absorption layer.

18. A backside illuminated (BSI) image sensor device, comprising:

a substrate comprising a circuit;

a blocking layer over the substrate; and a radiation-sensing region over the blocking layer, the radiation-sensing region being configured to detect a radiation wave entering from a back side of the substrate, wherein the blocking layer extends between the radiation-sensing region and the circuit, and is configured to prevent the radiation wave induced by the circuit from entering the radiation-sensing region.

19. The BSI image sensor device of claim 18, wherein the blocking layer comprises a reflective layer and an absorption layer.

20. The BSI image sensor device of claim 18, wherein the blocking layer is further configured to block a radiation from the back side so as not to influence the circuit.

* * * * *